United States Patent
Li et al.

(10) Patent No.: US 9,626,028 B2
(45) Date of Patent: Apr. 18, 2017

(54) GOA CIRCUIT, DRIVING METHOD THEREOF AND DISPLAY APPARATUS

(71) Applicant: BOE Technology Group Co., Ltd., Beijing (CN)

(72) Inventors: Wenbo Li, Beijing (CN); Yuanbo Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/772,638

(22) PCT Filed: Oct. 27, 2014

(86) PCT No.: PCT/CN2014/089586
§ 371 (c)(1),
(2) Date: Sep. 3, 2015

(87) PCT Pub. No.: WO2016/026209
PCT Pub. Date: Feb. 25, 2016

(65) Prior Publication Data
US 2016/0259455 A1   Sep. 8, 2016

(30) Foreign Application Priority Data

Aug. 18, 2014   (CN) .......................... 2014 1 0406028

(51) Int. Cl.
*G06F 3/038* (2013.01)
*G06F 3/041* (2006.01)
(Continued)

(52) U.S. Cl.
CPC .......... *G06F 3/0412* (2013.01); *G06F 3/0416* (2013.01); *G09G 3/3225* (2013.01);
(Continued)

(58) Field of Classification Search
CPC ... G06F 3/0412; G06F 3/0416; G09G 3/3677; G09G 3/3266; G09G 3/3225;
(Continued)

(56) References Cited

U.S. PATENT DOCUMENTS

| 7,825,888 B2 * | 11/2010 | Tobita | G09G 3/3648 |
| | | | 345/100 |
| 9,129,575 B2 * | 9/2015 | Ohara | G09G 3/3677 |

(Continued)

FOREIGN PATENT DOCUMENTS

| CN | 101634917 A | 1/2010 |
| CN | 101762915 A | 6/2010 |

(Continued)

OTHER PUBLICATIONS

Mar. 4, 2016—(CN)—First Office Action Appn 201410406028.5 with English Tran.

(Continued)

*Primary Examiner* — Rodney Amadiz
(74) *Attorney, Agent, or Firm* — Banner & Witcoff, Ltd.

(57) ABSTRACT

A Gate Driver on Array (GOA) circuit is disclosed. The GOA circuit comprising: a drive line scan control signal generation unit operative to generate a drive line scan clock signal and a drive line scan pulse signal; multiple GOA groups operative to acquire the drive line scan clock signal, to generate GOA group output signals sequentially according to GOA group input signals, wherein the GOA group output signal generated by one of the GOA groups is the GOA group input signal of a next GOA group to realize a shift register function of the multiple GOA groups; multiple drive line scan signal generation modules operative to acquire GOA group output signals and drive line scan pulse signal, and to generate drive line scan signals sequentially; multiple gate line groups operative to be applied with the
(Continued)

drive line scan signals, to complete drive line scan for the multiple gate line groups sequentially.

20 Claims, 5 Drawing Sheets

(51) Int. Cl.
| | | |
|---|---|---|
| G09G 3/3225 | (2016.01) | |
| G11C 19/00 | (2006.01) | |
| G09G 3/20 | (2006.01) | |
| G09G 3/3266 | (2016.01) | |
| G09G 3/36 | (2006.01) | |

(52) U.S. Cl.
CPC ............... *G11C 19/00* (2013.01); *G09G 3/20* (2013.01); *G09G 3/3266* (2013.01); *G09G 3/3677* (2013.01); *G09G 2310/0286* (2013.01); *G09G 2330/021* (2013.01)

(58) Field of Classification Search
CPC ... G09G 2300/0408; G09G 2310/0286; G09G 3/3685; G09G 3/3688; G09G 3/00; G09G 2300/0434; G02F 1/13454
See application file for complete search history.

(56) References Cited

U.S. PATENT DOCUMENTS

| | | |
|---|---|---|
| 2013/0328757 A1 | 12/2013 | Matsumoto et al. |
| 2014/0132526 A1 | 5/2014 | Lee et al. |
| 2015/0154927 A1* | 6/2015 | Li .......................... G09G 3/3677 |
| | | 345/214 |

FOREIGN PATENT DOCUMENTS

| | | |
|---|---|---|
| CN | 103279214 A | 9/2013 |
| CN | 103489414 A | 1/2014 |
| CN | 103913915 A | 7/2014 |
| JP | H0879663 A | 3/1996 |
| KR | 20040074633 A | 8/2004 |
| KR | 20140085995 A | 7/2014 |
| TW | 200636650 A | 10/2006 |

OTHER PUBLICATIONS

May 22, 2015—International Search Report Appn PCT/CN2014/089586 with Eng Tran of Written Opinion.

* cited by examiner

GOA CIRCUIT, DRIVING METHOD THEREOF AND DISPLAY APPARATUS

The application is a U.S. National Phase Entry of International Application No. PCT/CN2014/089586 filed on Oct. 27, 2014, designating the United States of America and claiming priority to Chinese Patent Application No. 201410406028.5 filed on Aug. 18, 2014. The present application claims priority to and the benefit of the above-identified applications and the above-identified applications are incorporated by reference herein in their entirety.

TECHNICAL FIELD OF THE DISCLOSURE

The present disclosure relates to a GOA (Gate Driver on Array) circuit, a driving method thereof, and a display apparatus.

BACKGROUND

In an In Cell Touch technology, a touch panel is not necessary to be laminated and assembled with a display panel, but is integrated into the display panel, so that the display panel per se has a touch function. The In Cell Touch display panel has advantages in that, a manufacture of a touch element can be completed in a standard manufacture process of the display panel, there is no problem in lamination and alignment, the product is thinner and lighter without a frame, and a pure flat plane design can be achieved. Currently, the In Cell Touch display panel has become one of hot spots in research in the field.

Currently, most of the In Cell Touch display panels adopt a projective multiple point capacitive touch technology, a touch function layer of which for realizing the touch function comprises two layers of signal lines vertically with each other, wherein one layer of the signal lines is a drive line (Tx line), and the other layer of the signal lines is a sensing line (Rx Line). Each drive line is driven in turn by scanning. In a process of driving the drive lines, the sensing lines intersected with the drive lines are scanned progressively. It is determined whether the capacitive coupling phenomenon occurs at a certain point or not, so that the accurate touch point location is obtained and the touch function is realized.

In the prior art, normally, a common electrode on an array substrate of the display panel will be divided properly, and the use of the drive line and the common electrode in common is realized in a way of time division driving. In such implementation, the drive line needs to be connected with a pin region of a touch chip through a peripheral circuit of the panel, and the touch chip needs to perform complicated operations such as a process of a time division signal and a computation process of a capacitance change, which results in a larger area and a higher cost of the chip, an increased area of the peripheral wirings of the panel, and results in a problem of a longer signal delay and a larger power consumption.

SUMMARY

A Gate Driver on Array (GOA) circuit is provided in an embodiment of the present disclosure, comprising: a drive line scan control signal generation unit operative to generate a drive line scan clock signal and a drive line scan pulse signal; multiple GOA groups connected with the drive line scan control signal generation unit and connected in series with each other sequentially, which are operative to acquire the drive line scan clock signal, to generate GOA group output signals sequentially according to GOA group input signals, wherein the GOA group output signal generated by one of the GOA groups is the GOA group input signal of a next GOA group so as to realize a shift register function of the multiple GOA groups; multiple drive line scan signal generation modules connected with the multiple GOA groups respectively and connected with the drive line scan control signal generation unit, which are operative to acquire the GOA group output signals and the drive line scan pulse signal, and to generate drive line scan signals sequentially; multiple gate line groups connected with the multiple drive line scan signal generation modules respectively, which are operative to be applied with the drive line scan signals, so as to complete drive line scan for the multiple gate line groups sequentially.

Alternatively, the GOA group comprises at least one GOA unit, the drive line scan signal generation module comprises at least one drive line scan signal generation unit, the gate line group comprises at least one gate line; at least one GOA unit in the GOA group is connected with the drive line scan control signal generation unit to be involved in the drive line scan, each of the GOA units involved in the drive line scan is connected to one of the gate lines through one of the drive line scan signal generation units.

Alternatively, the GOA group comprises the same number of multiple GOA units, the drive line scan signal generation module comprises the same number of multiple drive line scan signal generation units, the gate line group comprises the same number of multiple gate lines; the numbers of GOA units involved in the drive line scan in the GOA group are the same and are plural.

Alternatively, two adjacent GOA units involved in the drive line scan in the GOA group are spaced apart by at least one GOA unit not involved in the drive line scan, so as to interrupt the shift register function between the GOA unit involved in the drive line scan and the GOA unit not involved in the drive line scan; output signals of the GOA units involved in the drive line scan in one of the GOA groups are connected through a diode, to form the GOA group output signal as the GOA group input signal for the next GOA group.

Alternatively, the numbers of the GOA units not involved in the drive line scan spaced between two adjacent GOA units involved in the drive line scan are the same.

Alternatively, all the GOA units in the GOA group are connected with one of the gate lines through one of the drive line scan signal generation units.

Alternatively, the drive line scan control signal generation unit is connected with the GOA unit involved in the drive line scan through a diode, to ensure a unidirectional input of the drive line scan clock signal and to prevent a short circuit between the GOA units.

Alternatively, the drive line scan signal generation unit comprises an AND gate circuit, or the drive line scan signal generation unit comprises an NAND gate circuit and a NOT gate circuit.

Alternatively, a clock cycle of the drive line scan clock signal is time necessary for completing the scan for one drive line; a pulse width of the drive line scan pulse signal is a pulse width necessary for performing a touch scan.

Alternatively, the drive line scan clock signal includes a first drive line scan clock signal and a second drive line scan clock signal with reverse phases.

Alternatively, the drive line scan control signal generation unit is further operative to generate an original input signal for the drive line scan, as the GOA group input signal for the first GOA group.

Alternatively, the original input signal for the drive line scan is a square wave signal.

Alternatively, the gate line group comprises at least one gate line, and the GOA circuit further comprises: a thin-film transistor (TFT) connected with the gate line, a threshold voltage of the TFT being a voltage required to be applied when the gate line is taken as a drive line for touch drive, and the TFT being an oxide TFT.

A driving method for a Gate Driver on Array (GOA) circuit is further provided in another embodiment of the present disclosure, which is applied to the GOA circuit as described above, the driving method comprising: in a touch scan period of one frame, generating a drive line scan clock signal and a drive line scan pulse signal using the drive line scan control signal generation unit; acquiring the drive line scan clock signal and generating GOA group output signals sequentially according to GOA group input signals, using the multiple GOA groups, wherein the GOA group output signal generated by one of the GOA groups is the GOA group input signal of a next GOA group so as to realize a shift register function of the multiple GOA groups; acquiring the GOA group output signals and the drive line scan pulse signal, and generating the drive line scan signals sequentially, using the multiple drive line scan signal generation modules; applying the drive line scan signals to the multiple gate line groups, to complete drive line scan for the multiple gate line groups sequentially.

Alternatively, a voltage applied to the drive line scan signal generation module in a display scan period of one frame is larger than a voltage applied to the drive line scan signal generation module in the touch scan period, to ensure that a pixel is charged normally in a display period, and is turned off in a touch period and the drive line scan is performed for the multiple gate line groups.

A display apparatus is further provided in a further embodiment of the present disclosure, comprising the GOA circuit as described above.

In the GOA circuit, the driving method thereof and the display apparatus provided in the present disclosure, the drive line scan control signal generation unit and the drive line scan signal generation module are added into the original GOA circuit. The drive line scan control signal generation unit is connected with the input terminal of the GOA group comprising the GOA units and the drive line scan signal generation module is connected with the output terminal of the GOA group, so that all of, or part of GOA units in the GOA group are connected with the gate line group comprising gate lines through the drive line scan signal generation module. When driving in the touch scan period of one frame, the drive line scan clock signal and the drive line scan pulse signal are generated using the drive line scan control signal generation unit, combining with the shift register function of the GOA units, the gate line is taken as the drive line for touch scan, and the progressive scan for the drive line is completed.

DETAILED DESCRIPTION

Hereinafter, the technical solutions in embodiments of the present disclosure will be described clearly and thoroughly with reference to accompany drawings in the embodiments of the present disclosure. Obviously, the described embodiments are only a part, but not all, of the embodiments of the present disclosure. All the other embodiments derived by those of ordinary skill without any inventive labor based on the embodiments of the present disclosure shall fall within the protection scope of the present disclosure.

Figure 1:
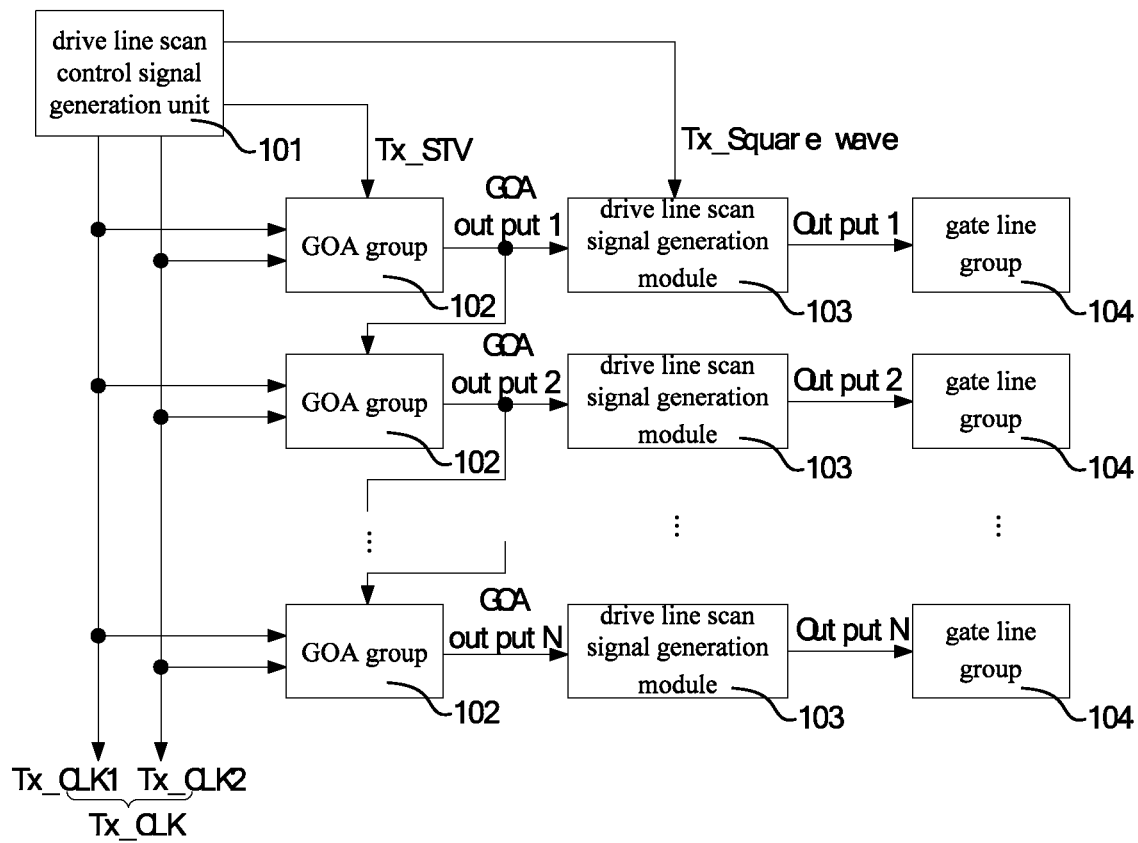
FIG. 1 is a structure diagram of a GOA circuit provided in an embodiment of the present disclosure.

As shown in FIG. 1, a GOA circuit is provided in the present embodiment, comprising: a drive line scan control signal generation unit 101 operative to generate a drive line scan clock signal Tx_CLK and a drive line scan pulse signal Tx_Square wave; multiple GOA groups 102 connected with the drive line scan control signal generation unit 101 and connected in series with each other sequentially, which are operative to acquire the drive line scan clock signal Tx_CLK, to generate GOA group output signals (i.e., GOA output1~GOA outputN) sequentially according to GOA group input signals, wherein the GOA group output signal generated by one of the GOA groups 102 is the GOA group input signal of the next GOA group 102 so as to realize a shift register function of the multiple GOA groups; multiple drive line scan signal generation modules 103 connected with the multiple GOA groups 102 respectively and connected with the drive line scan control signal generation unit 101, which are operative to acquire the GOA group output signals (i.e., GOA output1~GOA outputN) and the drive line scan pulse signal Tx_Square wave, and to generate drive line scan signals (i.e., Output1~OutputN) sequentially; multiple gate line groups 104 connected with the multiple drive line scan signal generation modules 103 respectively, which are operative to be applied with the drive line scan signals (i.e., Output1~OutputN), to complete drive line scan for the multiple gate line groups 104 sequentially.

The original GOA circuit comprises multiple GOA units in series with each other sequentially, the output terminal of each GOA unit is connected to one of the gate lines, the output terminal of one GOA unit is connected with the input terminal of the next GOA unit, so that the output signal of one GOA unit can be taken as the input signal of the next GOA unit. By applying an original input signal to the GOA unit, the shift register function of the individual GOA units may be realized. The gate lines connected with the individual GOA units are scanned progressively.

The GOA circuit described above in the present embodiments divides multiple GOA units into multiple GOA groups 102 in order, based on the original structure, so that the gate lines connected with the individual GOA units are divided into multiple gate line groups 104 in order. It can be seen that there is also the shift register function between the individual GOA groups 102 in the present embodiment.

The drive line scan control signal generation unit 101 is connected with the input terminal of the GOA group 102 to generate Tx_CLK and Tx_Square wave, wherein a clock cycle of Tx_CLK is time necessary for completing the scan for one drive line, i.e., the cycle of the drive line scan signal finally generated; and a pulse width of Tx_Square wave is a pulse width necessary for performing a touch scan, i.e., the pulse width of the drive line scan signal finally generated.

Also, the drive line scan signal generation module 103 is added between the GOA group 102 and the gate line group 104, to combine the GOA group output signal in which the cycle of the drive line scan signal is specified, with Tx_Square wave in which the pulse width of the drive line scan signal is specified, to generate the drive line scan signal necessary for scanning the drive line when performing the touch scan.

Due to the shift register function between the GOA groups 102, the drive line scan signals Output1~OutputN are generated group by group, which are applied to the connected gate line groups 104 so as to achieve the group-wise scan of the gate line groups 104.

It is to be noted that since the GOA circuit provided in present embodiment needs to realize the display scan function in addition to the touch scan function, the GOA circuit provided in the present embodiment may further comprise a display scan control signal generation unit. The display scan control signal generation unit is connected to the individual GOA units in the multiple GOA groups 102, and is used for providing the display scan control signal to the GOA units, so that the individual GOA units generate the display scan signals which are applied to the gate lines connected thereto, to realize the scan of the gate lines, to realize the shift register of the individual GOA units, and to scan all the gate lines progressively.

Additionally, in the present embodiment, in order to realize the shift register between the individual GOA groups 102, it is necessary to apply an original input signal Tx_STV for the drive line scan to the first GOA group 102 at the beginning, to take the original input signal Tx_STV for the drive line scan as the GOA group input signal of the first GOA group 102, so that the first GOA group 102 generates the first GOA group input signal GOA output1 with help of the drive line scan clock signal Tx_CLK and the original input signal Tx_STV for the drive line scan. Alternatively, the drive line scan control signal generation unit 101 may also be used to generate the original input signal Tx_STV for the drive line scan, which is the GOA group input signal of the first GOA group 102. In other embodiments of the present disclosure, the original input signal Tx_STV for the drive line scan may also be generated using the display scan control signal generation unit, and is not limited here in the present embodiment.

The GOA circuit provided in the present embodiments realizes the scan function with the gate line as the drive line in the touch scan period of one frame, using the shift register function of the GOA circuit, by adding the drive line scan control signal generation unit 101 and the drive line scan signal generation module 103 into the original GOA circuit. No additional drive circuit necessary for the drive line scan is required, thereby, the area and the number of pins in the chip are decreased, and the cost of the chip is reduced. The peripheral wirings for connecting the internal drive line with the external drive circuit is saved, which is helpful in a narrow frame of the display panel. The gate line is connected with the GOA circuit inside of the display panel directly, and it does not need to be connected with the external drive circuit through the peripheral circuit, which is helpful to decrease the signal delay and to save the power consumption.

Accordingly, a driving method for the GOA circuit described above is provided in the present embodiment, comprising: in a touch scan period of one frame, generating a drive line scan clock signal Tx_CLK and a drive line scan pulse signal Tx_Square wave using the drive line scan control signal generation unit 101; acquiring the drive line scan clock signal Tx_CLK and generating GOA group output signals (i.e., GOA output1~GOA outputN) sequentially according to GOA group input signals, using the multiple GOA groups, wherein the GOA group output signal generated by one of the GOA groups 102 is the GOA group input signal of the next GOA group so as to realize a shift register function of the multiple GOA groups 102; acquiring the GOA group output signals (i.e., GOA output1~GOA outputN) and the drive line scan pulse signal Tx_Square wave, and generating drive line scan signals (i.e., Output1~OutputN) sequentially, using the multiple drive line scan signal generation modules 103; applying the drive line scan signals (i.e., Output1~OutputN) to the multiple gate line groups 104, to complete drive line scan for the multiple gate line groups 104 sequentially.

In the driving method for the GOA circuit described above, the time of one frame is divided into the display scan period and the touch scan period. After all the gate lines have been scanned progressively and all the pixels connected with the gate lines have been charged, the display scan period ends, and it enters the touch scan period. In the touch scan period, by specifying the cycle of the drive line scan signal using Tx_CLK which is introduced additionally, specifying the pulse width of the drive line scan signal using Tx_Square wave, and using the shift register function between the individual GOA groups to scan the individual gate line groups 104 group by group, the time division multiplexing of gate lines is realized, so that the GOA circuit has both the pixel drive function and the touch scan function.

Figure 2:
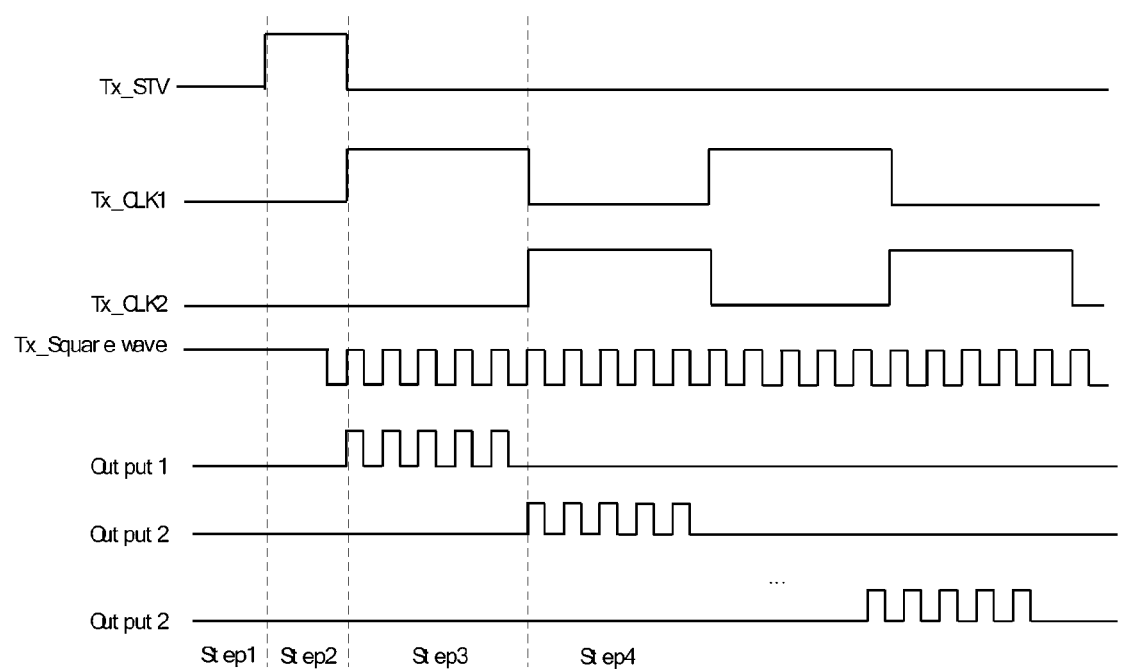
FIG. 2 is a drive timing chart for the GOA circuit provided in the embodiment of the present disclosure.

Hereinafter, the driving method for the GOA circuit provided in the present embodiment is described with reference to the timing chart shown in FIG. 2. In the time of one frame, operations of Step 1~Step 4 are performed sequentially.

In Step 1, in a pixel charge time, i.e., the display scan period, the touch scan control signal Tx_CLK (i.e., Tx_CLK1 and Tx_CLK2) and Tx_STV are at a low level, and Tx_Square wave is at a high level. The individual GOA units in the circuit are in operation normally and are all involved in the display scan. The individual gate lines connected with the individual GOA units are scanned progressively. The Thin-Film Transistor (TFT) is turned on to complete the charge to all the pixels.

In Step 2, the charge to the pixels has been finished, and it begins to perform the touch scan. Tx_STV is input as the GOA group input signal of the first GOA group, and at the same time it begins to input the drive line scan clock signal Tx_CLK, the clock cycle of which is the time for allocating one row of drive line scan, and Tx_Square wave begins to output the square wave, the pulse width of which is about the pulse width required for the touch scan signal, generally between several microseconds to several tens of microseconds. The scan for one row of drive line comprises multiple pulses.

In Step 3, the shift register function is realized in the first GOA group. The GOA group output signal output by the first GOA group and Tx_Square wave form the pulse square wave necessary for the drive line scan, i.e., the drive line scan signal Output1 which is output, through the drive line scan signal generation module 103. Meanwhile, the GOA group output signal output by the first GOA group is taken as the GOA group input signal of the second GOA group.

In Step 4, the shift register function is realized in the second GOA group. The pulse square wave begins to be output at Output2, and the shift register are performed in subsequent GOA groups in order, the Outputs are turned on group by group, until the scan of all Outputs are finished. The process in one frame is completed, and the pixels in the next frame begin to be charged.

The entire structure of the GOA circuit and the driving method thereof provided in the present embodiment have been described above. The connection relationship between the single GOA group 102 and the drive line scan signal generation module 103 as well as the gate line group 104 connected thereto in the circuit is not limited.

Generally, the accuracy degree of determining the touch point which is necessary for the touch scan does not need to reach the accuracy degree which can be achieved in the drive line scan for each gate line. That is, when the gate lines are multiplexed for the drive line scan, it is not required to scan each gate line progressively.

In the present embodiment, exemplarily, the GOA group 102 may comprise at least one GOA unit, the drive line scan signal generation module 103 may comprise at least one drive line scan signal generation unit, the gate line group 104 may comprise at least one gate line. At least one GOA unit in the GOA group 102 is connected with the drive line scan control signal generation unit to be involved in the drive line scan. Each of the GOA units involved in the drive line scan is connected with one of the gate lines through one of the drive line scan signal generation units. That is, in the present embodiment, exemplarily, a part of GOA units and the gate lines connected thereto may be selected from all the GOA units and the gate lines connected thereto (the number of GOA units and that of the gate lines are the same, and the GOA units are connected to the gate lines respectively), to be involved in the drive line scan, and the GOA units and the gate lines connected thereto which are involved in the drive line scan are configured with the drive line scan signal generation unit to satisfy the requirement for accuracy degree of the touch scan.

The number of the GOA units and the gate lines which are selected to be involved in the drive line scan may be determined depending on the requirement for accuracy degree of the touch scan. If the requirement for accuracy degree of the touch scan is relatively high, more, even all of, GOA units and gate lines may be selected for the drive line scan. If the requirement for accuracy degree of the touch scan is not very high, but it requires a relatively strict control of the manufacture cost, less GOA units and gate lines may be selected for the drive line scan to further simplify the circuit, reduce the chip area and decrease the chip cost.

The distribution of the gate lines corresponding to the selected GOA units on the display panel may be arranged according to the actual touch requirement. For example, the touch to the upper or lower region of the display panel may be less than that to the middle region of the display panel. Therefore, more gate lines and corresponding GOA units in the middle region may be selected, so that the gate lines involved in the drive line scan is distributed denser in the middle region of the display panel, than in the upper or lower region, so as to satisfy the requirement for more and more accurate touch operations on the middle region.

It is to be noted that the number of GOA units and that of gate lines in the present embodiment are the same and are in a one-one correspondence, but the number of drive line scan signal generation units is smaller than or equal to that of the GOA units. In each group, the GOA unit and the gate line involved in the gate line scan are required to be configured with one drive line scan signal generation unit, and the GOA unit and the gate line not involved in the drive line scan may be selected to be configured or not configured with the drive line scan signal generation unit depending on the actual condition. If considering a lower cost and a lower circuit complexity, the GOA unit and the gate line not involved in the drive line scan may not be configured with the drive line scan signal generation unit. That is, the GOA unit not involved in the drive line scan is not connected with the gate line through the drive line scan signal generation unit, but is connected with the gate line directly. If considering a flexible circuit adapting to different requirements, part of, or all the GOA units not involved in the drive line scan may be configured with the drive line scan signal generation unit. That is, part of, or all the GOA units not involved in the drive line scan are connected with the gate line through the drive line scan signal generation unit, the others are connected with the gate line directly. Therefore, when the accuracy degree of the touch scan and the touch requirement for different region are changed, different requirements may be satisfied with only a change to software program or a slight change to the circuit.

Further, it is to be noted that the groupings of the GOA units, the gate lines and the drive line scan signals in the present embodiment are for a purpose of a fully control of the touch scan function. How to group is not limited in the present embodiment. The numbers of GOA units comprised in the individual GOA groups 102 may be the same or be different. Correspondingly, the numbers of drive line scan control signal generation units comprised in the individual drive line scan control signal generation modules 103 may be the same or different, and is the same as that of GOA units involved in the drive line scan in the corresponding GOA group 102. The numbers of gate lines comprised in the individual gate line groups 104 may be the same or different, and is the same as the total number of GOA units comprised in the corresponding GOA group 102.

Hereinafter, an exemplary connection relationship between a single GOA group 102 and the drive line scan signal generation module 103 as well as the gate line group 104 connected thereto will be described in detail.

Figure 3:
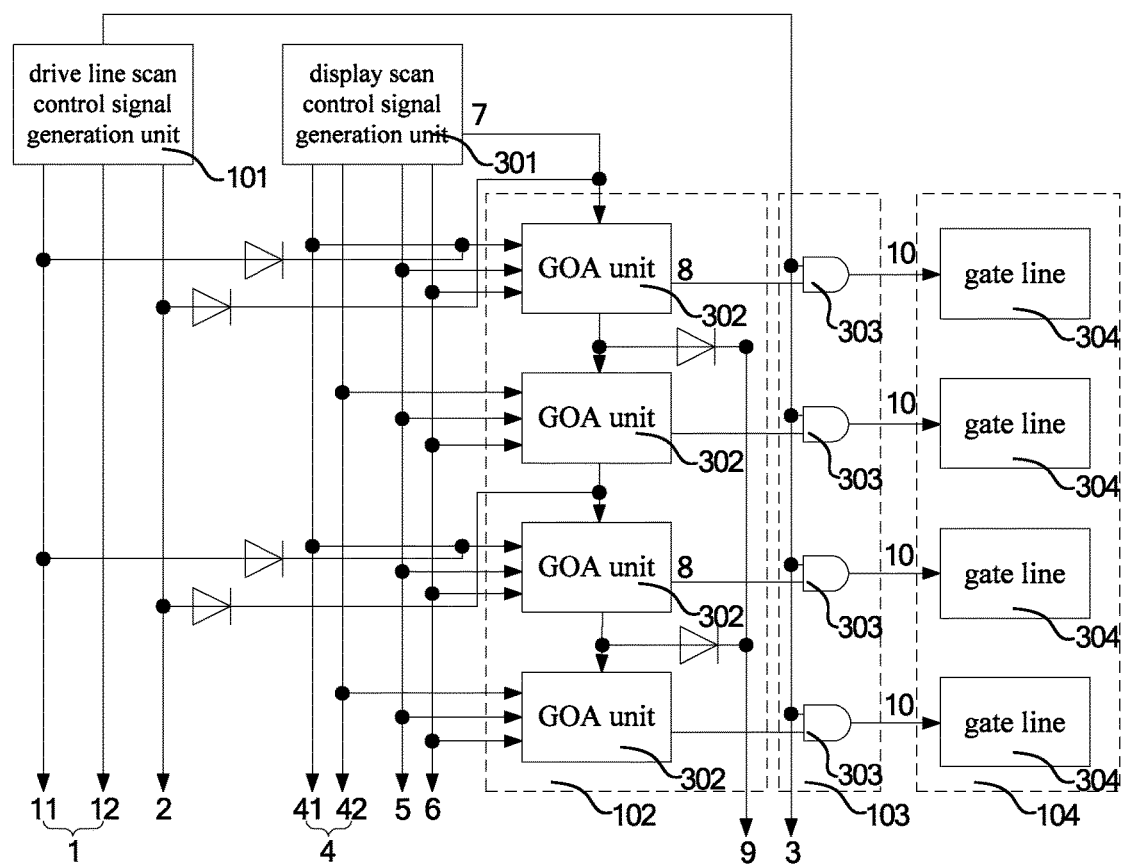
FIG. 3 is an internal structure diagram of a single GOA group, a drive line scan signal generation module and a gate line group in the GOA circuit provided in the embodiment of the present disclosure.

As shown in FIG. 3, the exemplary GOA group 102 in the present embodiment comprises the same number of multiple GOA units 302, the drive line scan signal generation module 103 comprises the same number of multiple drive line scan signal generation units 303, and the gate line group 104 comprises the same number of multiple gate lines 304. On the basis of this, further, each of all the GOA units 302 in one GOA group 102 is connected to one of the gate lines 304 through one of the drive line scan signal generation units 303. The numbers of GOA units 302 involved in the drive line scan in the GOA group 102 are exemplarily the same and plural. The two adjacent GOA units 302 involved in the drive line scan in the GOA group 102 are spaced apart by at least one GOA unit 302 not involved in the drive line scan exemplarily, so as to interrupt the shift register function between the GOA unit 302 involved in the drive line scan and the GOA units 302 not involved in the drive line scan. Exemplarily, the numbers of GOA units 302 not involved in the drive line scan spaced between the two adjacent GOA units 302 involved in the drive line scan are the same.

Based on the exemplary scheme described above, the structure may be designed, for example, in a way that each GOA group 102 comprises four (exemplarily being four, and normally the actual number being larger than four) GOA units 302, the drive line scan signal generation module 103 connected with the GOA group 102 comprises four drive line scan signal generation units 303 connected with the GOA units 302 respectively, and the gate line group 104 connected with the drive line scan signal generation module 103 comprises four gate lines connected with the drive line scan signal generation units 303 respectively. The first and the third GOA units 302 are selected to be involved in the drive line scan, and the two adjacent GOA units 302 involved in the drive line scan are spaced apart by one GOA unit not involved in the drive line scan.

In the present embodiment, the internal operation process of the single GOA group 102 and the drive line scan signal generation module 103 as well as the gate line group 104 connected thereto may be as follows, for example.

Figure 4:
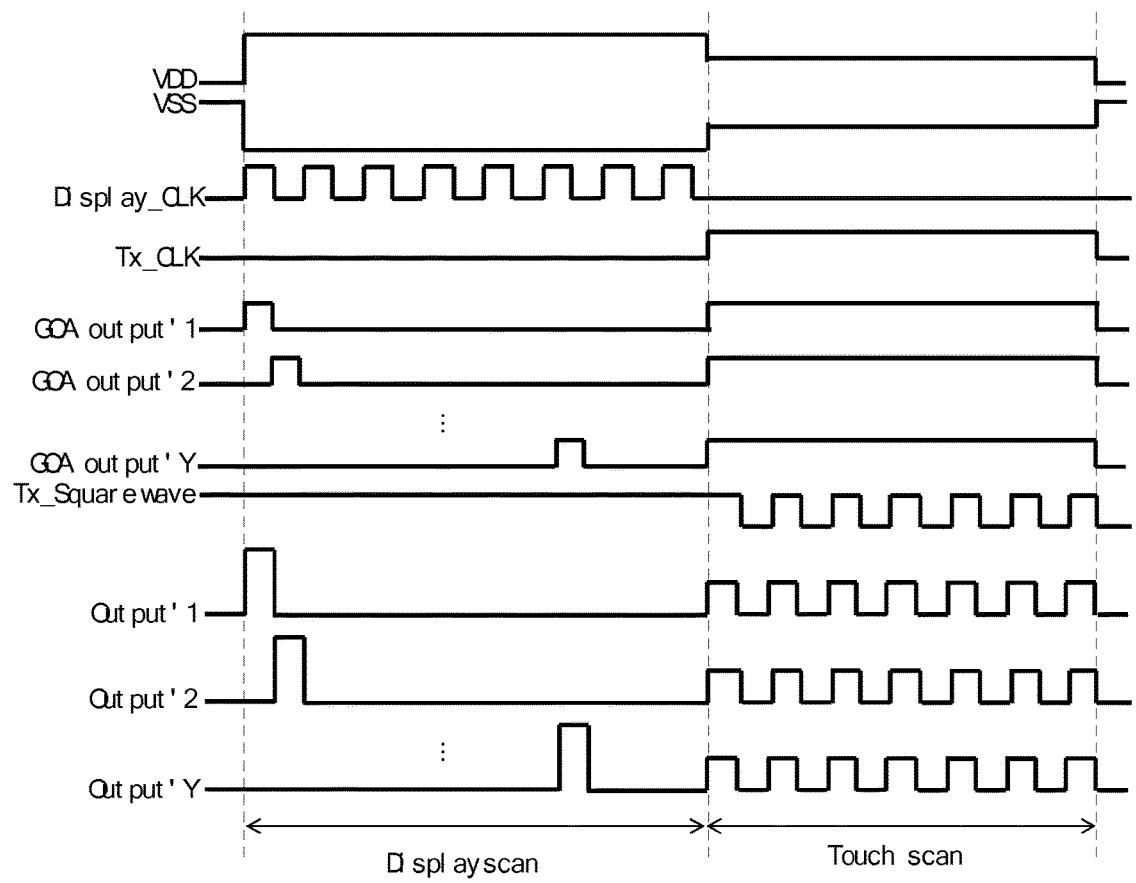
FIG. 4 is a drive timing chart for the single GOA group, the drive line scan signal generation module and the gate line group in the GOA circuit provided in the embodiment of the present disclosure.

Referring to FIGS. 3 and 4, in one frame time, in the display scan period and within one GOA group, the display scan clock signal Display_CLK as shown by the numeral 4 in FIG. 3, the DC signal VGH necessary for the display scan as shown by the numeral 5 in FIG. 3, and the DC signal VGL as shown by the numeral 6 in FIG. 3, are generated using the display scan control signal generation unit 301, and are output to the GOA unit 302. At the same time, the original input signal Display_STV for display scan as shown by the numeral 7 in FIG. 3 is generated by the display scan control signal generation unit 301, the first GOA unit 302 is driven to begin to perform the shift register, so that the individual GOA units 302 generate the display scan signals sequentially (assuming that the GOA unit 102 comprises X number of GOA units 302, and the display scan signals being Output'1~Output'X), which are output to the corresponding gate lines 304 to complete the progressive scan for all the gate lines 304 in the GOA group 102.

Then, it enters the touch scan period. In the above GOA group, Tx_CLK as shown by the numeral 1 in FIG. 3 and Tx_STV as shown by the numeral 2 in FIG. 3, generated by the drive line scan control signal generation unit 101 are applied to the GOA unit 302 involved in the drive line scan, so as to drive and control the GOA unit 302 to generate the output signal of the GOA unit (assuming that there are Y number of GOA units in the GOA unit 102 comprising X number of GOA units involved in the drive line scan, the output signals of the GOA units being GOA output'1~GOA output'Y, as shown by the numeral 8 in FIG. 3). Here, exemplarily, the drive line scan control signal generation unit 101 may be connected with the GOA unit 302 involved in the drive line scan through a diode, so as to ensure the unidirectional input of Tx_CLK and to prevent the short circuit between the GOA units 302. Further, a diode may be added between a pin for outputting Tx_STV in the drive line scan control signal generation unit 101 and the GOA unit 302 to ensure the unidirectional input of Tx_STV.

After the GOA units 302 involved in the drive line scan in the GOA group 102 described above generate the output signals of the GOA units, exemplarily, the output signals of the GOA units may be connected through a diode to form the GOA group output signal, GOA output, as shown by the numeral 9 in FIG. 3, as the GOA group input signal of the next GOA group 102. At the same time, each of the output signals of the GOA units generated by the GOA units 302 involved in the drive line scan in the GOA group 102 is output to the corresponding drive line scan signal generation unit 303, so as to generate the drive line scan signals (i.e., Output'1~Output'Y as shown by the numeral 10 in FIG. 3) under the function of Tx_Square wave, as shown by the numeral 3 in FIG. 3, applied by the drive line scan control signal generation unit 101. It is to be noted that the drive line scan signal is output only at the drive line scan signal generation unit 303 connected with the GOA unit 302 involved in the drive line scan, and no drive line scan signal is output at the drive line scan signal generation unit 303 connected with the GOA unit 302 not involved in the drive line scan.

In one drive line scan signal generation module 103, after the drive line scan signal generation unit 303 connected with the GOA unit 302 involved in the drive line scan generates the drive line scan signal, the drive line scan signal is applied onto the corresponding gate line 304, so that the specific gate line may be scanned as the drive line.

It is to be noted that from the internal operation process of the single GOA unit 102 described above and the drive line scan signal generation module 103 as well as the gate line group 104 connected thereto, it may be known that in the same GOA group 102, all the GOA units 302 involved in the drive line scan generate GOA output'1~GOA output'Y at the same time under the function of Tx_CLK and Tx_STV. Correspondingly, in the drive line scan signal generation module 103 connected with the GOA group 102, all the drive line scan signal generation units 303 connected with the GOA units 302 involved in the drive line scan generate Output'1~Output'Y at the same time under the function of TX_Square wave and GOA output'1~GOA output'Y. Further, in the gate line group 104 corresponding to the GOA group 102, all the gate lines 304 involved in the drive line scan are applied with Output'1~Output'Y at the same time to complete the scan. It can be seen that in the present embodiment, there is no shift register between the GOA unit 302 involved in the drive line scan and the GOA units 302 not involved in the drive line scan in the same GOA group, and there is the shift register between the individual GOA groups 102.

It is to be noted that in the internal structure diagram shown in FIG. 3, Tx_STV is generated by the drive line scan control signal generation unit 101, and Display_STV is generated by the display scan control signal generation unit 301. In other embodiments of the present disclosure, Tx_STV and Display_STV may also be generated by the display scan control signal generation unit 301.

Additionally, exemplarily, Tx_CLK may exemplarily comprise a first drive line scan clock signal Tx_CLK1 as shown by the numeral 11 in FIG. 3 and a second drive line scan clock signal Tx_CLK2 as shown by the numeral 12 in FIG. 3, in reverse phase with each other, so as to ensure a stable and accurate output of Tx_CLK. Similarly, Display_CLK may exemplarily comprise a first display scan clock signal Display_CLK1 as shown by the numeral 41 in FIG. 3 and a second display scan clock signal Display_CLK2 as shown by the numeral 42 in FIG. 3, in reverse phase with each other, so as to ensure a stable and accurate output of Display_CLK.

FIG. 4 only shows the drive timings of Y number of GOA units 302 involved in the drive line scan in one GOA group 102 and the touch scan signal generation units 303 as well as the gate lines 304 connected with the Y number of GOA units 302. The drive timings of the (X-Y) number of GOA units 302 not involved in the drive line scan in the GOA group 102 and the touch scan signal generation units 303 as well as the gate lines 304 connected with the (X-Y) number of GOA units 302 are the same as those in the prior art in the display scan period, and are not operated in the touch scan period.

In the present embodiment, the drive line scan signal generation unit 303 may exemplarily use an AND logic, and the drive line scan signal generation unit 303 may comprise an AND circuit, or comprise an NAND circuit and an NOT circuit. Additionally, the drive line scan signal generation unit 303 needs to be powered externally so as to operate normally, and the external voltage provided to the drive line scan signal generation unit 303 is determined according to different requirements in different periods. Since normally the value of the voltage to be output by the gate line in the display scan period is larger than that in the touch scan period, exemplarily, the voltage applied to the drive line scan signal generation module 103, which is applied to the drive line scan signal generation unit 303 actually, in the display scan period of one frame is larger than that in the touch scan period, so as to ensure that the pixels are charged normally in the display period and are turned off in the touch period, and that the drive line scan is performed for multiple gate lines 104.

Figure 5:
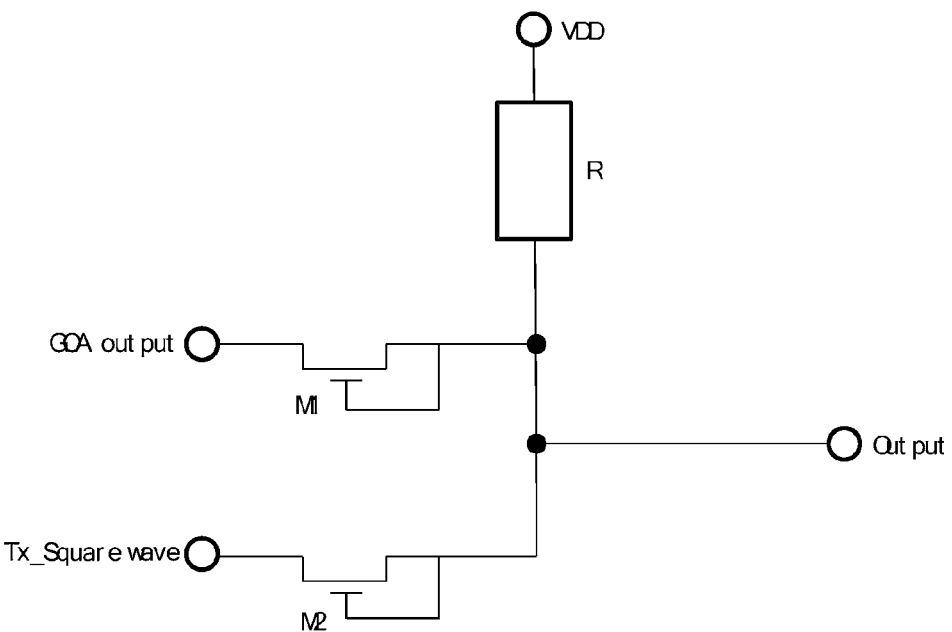
FIG. 5 is a circuit diagram of an implementation of a drive line scan signal generation unit in the GOA circuit provided in the embodiment of the present disclosure.

When the drive line scan signal generation unit 303 is realized by the AND gate circuit, exemplarily, the structure may be as shown in FIG. 5 exemplarily, in which the GOA output terminal is the input terminal to which the output signal of the GOA unit is input; the Tx_Square wave terminal is also the input terminal to which the drive line scan pulse signal is input, and the Output terminal is the output terminal from which the drive line scan signal is output. The GOA output terminal is connected with a diode M1 which may be exemplarily realized by an N-type TFT with the gate and the drain connected with each other. The Tx_Square wave terminal is connected with a diode M2 which may also be exemplarily realized by an N-type TFT with the gate and the drain connected with each other. A resistor R is connected at a common terminal of M1 and M2 and provides an offset voltage to the AND gate circuit through an external voltage VDD, which may be exemplarily realized by at least one TFT.

In the above circuit, when the high level is input to the GOA output terminal and the Tx_Square wave terminal, two diodes M1 and M2 are both cut off, the high level is output at the Output terminal, and the drive line scan signal is output. When any one or more than one of the GOA output terminal and the Tx_Square wave is at the low level, the corresponding diode M1 or M2 is turned on, the Output terminal is pulled down to the positive voltage drop of the diode, i.e., the low level, and no drive line scan signal is output.

It is to be noted that, in the present embodiment, in order to ensure the normal operation in the display scan period and the touch scan period, exemplarily, different values of voltages may be applied to VDD in the two periods respectively, so that the VDD voltage value in the display scan period is larger than that in the touch scan period.

Figure 6:
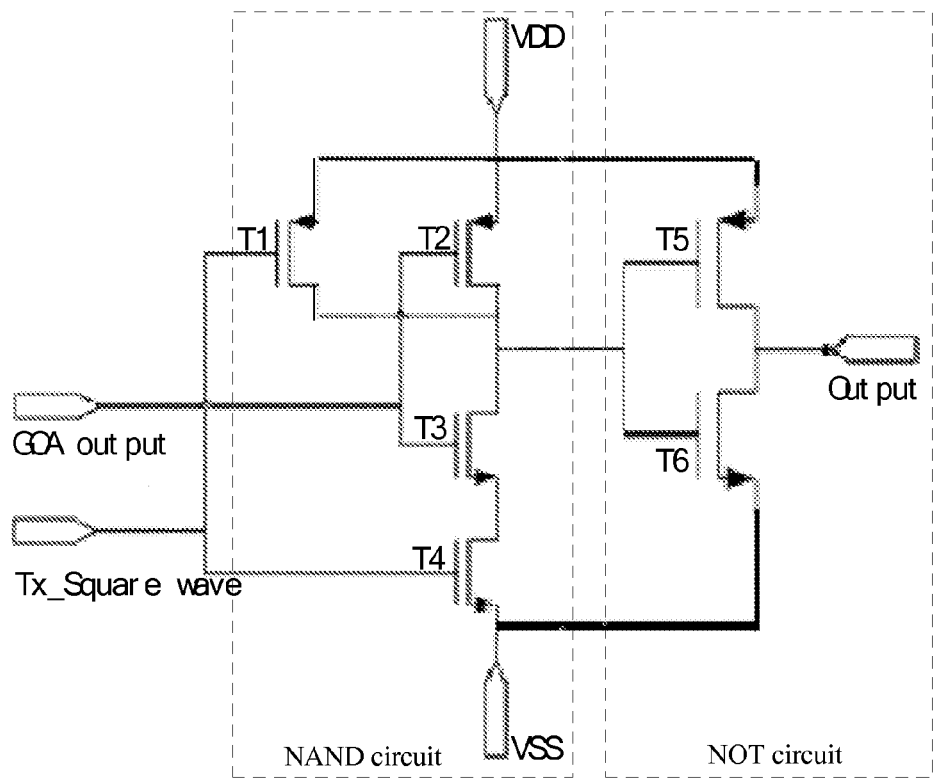
FIG. 6 is a circuit diagram of another implementation of the drive line scan signal generation unit in the GOA circuit provided in the embodiment of the present disclosure.

When the drive line scan signal generation unit 303 is realized by the NAND gate circuit in combination with the NOT gate circuit, the structure may be as shown in FIG. 6 exemplarily, in which the GOA output terminal is the input terminal to which the output signal of the GOA unit is input, the Tx_Square wave terminal is also the input terminal to which the drive line scan pulse signal is input, and the Output terminal is the output terminal from which the drive line scan signal is output; the NAND gate circuit is as shown in the slash box in the left, comprising four TFTs T1-T4 with the positive voltage being provided by VDD and the negative voltage being provided by VSS; the NOT gate circuit is as shown in the slash box in the right, which may be also referred to as an inverter circuit, comprising two TFTs T5 and T6.

With the above circuit, it may also be realized that the high level is output at the Output terminal only when the high level is input to both the GOA output terminal and the Tx_Square wave terminal, and the low level is output at the Output terminal when any one or more than one of the GOA output terminal and the Tx_Square wave is at the low level.

It is to be noted that in the above circuit, in order to ensure that the high voltage output by the gate line in the display scan period is above 10V and the high voltage output by the gate line in the touch scan period is about 3V, exemplarily, different values of voltages may be applied to VDD and VSS in the two periods. The timings of VDD and VSS may be referred to FIG. 4. In the display scan period, the GOA unit 302 is provided with the high level in a range of 10V~30V for example, and the low level in a range of −8V~−12V for example, necessary for the normal charge, by VDD and VSS respectively, so as to turn on the TFT controlling the pixels to ensure that the pixels are charged. In other embodiments of the present disclosure, the values of VDD and VSS may be each determined depending on requirements and are not necessarily within the above ranges. In the touch scan period, VDD and VSS may be decreased to about +3V and −3V respectively, for example, so as to ensure that the TFT controlling the pixels is turned off in the drive line scan of the normal touch drive. The values of VDD and VSS may be each determined depending on requirements and are not necessarily within the above ranges.

In the GOA circuit provided in the present embodiment, the gate line group 104 comprises at least one gate line 304. The GOA circuit further comprises a TFT connected with the gate line 304, which is turned on under driven by the gate line 304 to charge the corresponding pixel.

The GOA circuit in the present embodiment can realize a time division multiplexing for the gate lines 304. However, when the gate line is taken as the drive line of the touch signal in the touch scan period, it requires a large voltage, generally between 3V~5V, which may cause the TFT controlling the charge to the pixels to generate a relatively large leak current, affecting the actual voltage of the pixel and thus affecting the display effect of the image.

In order to prevent the above situation, exemplarily, the threshold voltage of the TFT may be the voltage necessary to be applied when the gate line is taken as the drive line for the touch drive, so that when the scan is performed for the gate line in the touch scan period, the TFT with the high threshold voltage is always in a turned off state, the leak current is very small, and the touch scan operation is completed with little effect on the pixel voltage.

In the present embodiment, the high threshold voltage of the TFT may be realized by changing the thickness and the material of the gate insulation layer, a doping process adjustment, or the like. Taking a TFT with the threshold voltage of 3V~5V as an example, for example, the gate insulation layer may be manufactured by, for example, a silicon oxide material, in a plasma chemical vapor deposition process, so that the threshold voltage of the TFT may be about 10V. Then, the TFT array substrate which has been manufactured is subject to an annealing process, with the annealing temperature between 280° C.~300° C. and the annealing time being 1 hour, so that the threshold voltage of the TFT may be decreased to about 3V~5V.

Additionally, the TFT controlling the charge to the pixels in the present embodiment may be exemplarily an oxide TFT. Compared to other types of TFT, the oxide TFT has a smaller sub threshold amplitude, a faster operation speed in the sub threshold region, and may make the leak current change substantially without increasing the turn on voltage of the TFT substantially.

The elements in the GOA circuit provided in the present embodiment may use various types of TFTs, such as a Low Temperature Poly-Silicon, a monosilicon, an oxide TFT or the like, so as to simplify the manufacture process of the circuit and meanwhile optimize the circuit performance.

The realization of the drive line scan in the touch scan is mainly described in the present embodiment in detail. The sensing line scan in the touch drive may be realized in a way of a common electrode, a common data line, a sensing line made individually, or the like.

Based on the GOA circuit provided in the present embodiment, a display apparatus is further provided in the present embodiment, which comprises the GOA circuit described in the present embodiment. Since the GOA circuit provided in the present embodiment may perform the time division multiplexing for the gate lines to realize the integration of display scan and touch scan functions and save the area of the control chip, it is helpful in making the display apparatus thinner and lighter. Also, since the complexity of the control chip circuit is decreased, the cost of the control chip may be decreased, and the entire manufacture cost of the display apparatus may be decreased. Further, the touch scan function is integrated into the GOA circuit so that the peripheral wirings of the display panel is decreased, which is helpful in realizing a display apparatus with a narrow frame. Meanwhile, the touch scan function is integrated into the GOA circuit, which is helpful in decreasing the signal delay and decreasing the power consumption of the apparatus.

The type of display apparatus to which the GOA circuit is applied is not limited in the present embodiment, and may be a liquid crystal display apparatus, an organic light emitting diode display apparatus, or the like.

The above is only a detailed implementation of the present disclosure, and the protection scope of the present disclosure is not limited thereto. Any variation or substitution easily conceived of by those skilled in the art within the technical scope disclosed by the present disclosure shall fall within the protection scope of the present disclosure. Thus, the protection scope of the present disclosure is limited by the claims.

The present application claims a priority of a Chinese patent application No. 201410406028.5 filed on Aug. 18, 2014, the content of which is incorporated herein entirely by reference as a part of the present application.

What is claimed is:

1. A Gate Driver on Array (GOA) circuit, comprising:
  a drive line scan control signal generation circuit configured to generate a drive line scan clock signal and a drive line scan pulse signal;
  multiple GOA groups connected with the drive line scan control signal generation circuit and connected in series with each other sequentially, which are configured to acquire the drive line scan clock signal, to generate GOA group output signals sequentially according to GOA group input signals, wherein the GOA group output signal generated by one of the GOA groups is the GOA group input signal of a next GOA group so as to realize a shift register function of the multiple GOA groups;
  multiple drive line scan signal generation circuits connected with the multiple GOA groups respectively and connected with the drive line scan control signal generation circuit, which are configured to acquire the GOA group output signals and the drive line scan pulse signal, and to generate drive line scan signals sequentially;
  multiple gate line groups connected with the multiple drive line scan signal generation circuits respectively, which are configured to be applied with the drive line scan signals, so as to complete drive line scan for the multiple gate line groups sequentially.

2. The GOA circuit of claim 1, wherein the GOA group comprises at least one GOA circuit, the drive line scan signal generation circuit comprises at least one drive line scan signal generation circuit, the gate line group comprises at least one gate line;
  at least one GOA circuit in the GOA group is connected with the drive line scan control signal generation circuit to be involved in the drive line scan, each of the GOA circuits involved in the drive line scan is connected to one of the gate lines through one of the drive line scan signal generation circuits.

3. The GOA circuit of claim 2, wherein the GOA group comprises the same number of multiple GOA circuits, the drive line scan signal generation circuit comprises the same number of multiple drive line scan signal generation circuits, the gate line group comprises the same number of multiple gate lines;
  the numbers of GOA circuits involved in the drive line scan in the GOA group are the same and are plural.

4. The GOA circuit of claim 3, wherein two adjacent GOA circuits involved in the drive line scan in the GOA group are spaced apart by at least one GOA circuit not involved in the drive line scan, so as to interrupt the shift register function between the GOA circuit involved in the drive line scan and the GOA circuit not involved in the drive line scan;
  output signals of the GOA circuits involved in the drive line scan in one of the GOA groups are connected through a diode, to form the GOA group output signal as the GOA group input signal for the next GOA group.

5. The GOA circuit of claim 4, wherein the numbers of the GOA circuits not involved in the drive line scan spaced between two adjacent GOA circuits involved in the drive line scan are the same.

6. The GOA circuit of claim 2, wherein the drive line scan signal generation circuit is configured for the GOA circuit and the gate line involved in the drive line scan, and the drive line scan signal generation circuit is selected to be configured or not to be configured for the GOA circuit and the gate line not involved in the drive line scan, in each group.

7. The GOA circuit of claim 2, wherein all the GOA circuits in the GOA group are connected with one of the gate lines through one of the drive line scan signal generation circuits.

8. The GOA circuit of claim 2, wherein the drive line scan control signal generation circuit is connected with the GOA circuit involved in the drive line scan through a diode, to ensure a unidirectional input of the drive line scan clock signal and to prevent a short circuit between the GOA circuits.

9. The GOA circuit of claim 2, wherein the drive line scan signal generation circuit comprises an AND gate circuit, or the drive line scan signal generation circuit comprises an NAND gate circuit and a NOT gate circuit.

10. The GOA circuit of claim 1, wherein a clock cycle of the drive line scan clock signal is time necessary for completing the scan for one drive line;
  a pulse width of the drive line scan pulse signal is a pulse width necessary for performing a touch scan.

11. The GOA circuit of claim 10, wherein the drive line scan clock signal includes a first drive line scan clock signal and a second drive line scan clock signal with reverse phases.

12. The GOA circuit of claim 1, wherein the drive line scan control signal generation circuit is further configured to generate an original input signal for the drive line scan, as the GOA group input signal for the first GOA group.

13. The GOA circuit of claim 12, wherein the original input signal for the drive line scan is a square wave signal.

14. The GOA circuit of claim 1, wherein the gate line group comprises at least one gate line, and the GOA circuit further comprises: a thin-film transistor (TFT) connected with the gate line, a threshold voltage of the TFT being a voltage required to be applied when the gate line is taken as a drive line for touch drive, and the TFT being an oxide TFT.

15. A driving method for a Gate Driver on Array (GOA) circuit applied to the GOA circuit of claim 1, comprising:
   in a touch scan period of one frame, generating a drive line scan clock signal and a drive line scan pulse signal using the drive line scan control signal generation circuit;
   acquiring the drive line scan clock signal and generating GOA group output signals sequentially according to GOA group input signals, using the multiple GOA groups, wherein the GOA group output signal generated by one of the GOA groups is the GOA group input signal of a next GOA group so as to realize a shift register function of the multiple GOA groups;
   acquiring the GOA group output signals and the drive line scan pulse signal, and generating the drive line scan signals sequentially, using the multiple drive line scan signal generation circuits;
   applying the drive line scan signals to the multiple gate line groups, to complete drive line scan for the multiple gate line groups sequentially.

16. The driving method for the GOA circuit of claim 15, wherein a voltage applied to the drive line scan signal generation circuit in a display scan period of one frame is larger than a voltage applied to the drive line scan signal generation circuit in the touch scan period, to ensure that a pixel is charged normally in a display period, and is turned off in a touch period and the drive line scan is performed for the multiple gate line groups.

17. A display apparatus comprising the GOA circuit of claim 1.

18. The display apparatus comprising the GOA circuit of 17, wherein the GOA group comprises at least one GOA circuit, the drive line scan signal generation circuit comprises at least one drive line scan signal generation circuit, the gate line group comprises at least one gate line;
   at least one GOA circuit in the GOA group is connected with the drive line scan control signal generation circuit to be involved in the drive line scan, each of the GOA circuits involved in the drive line scan is connected to one of the gate lines through one of the drive line scan signal generation circuits.

19. The display apparatus comprising the GOA circuit of 18, wherein the GOA group comprises the same number of multiple GOA circuits, the drive line scan signal generation circuit comprises the same number of multiple drive line scan signal generation circuits, the gate line group comprises the same number of multiple gate lines;
   the numbers of GOA circuits involved in the drive line scan in the GOA group are the same and are plural.

20. The display apparatus comprising the GOA circuit of 18, wherein the drive line scan signal generation circuit is configured for the GOA circuit and the gate line involved in the drive line scan, and the drive line scan signal generation circuit is selected to be configured or not to be configured for the GOA circuit and the gate line not involved in the drive line scan, in each group.

* * * * *